United States Patent [19]
Cuthbert et al.

[11] Patent Number: 5,264,076
[45] Date of Patent: Nov. 23, 1993

[54] INTEGRATED CIRCUIT PROCESS USING A "HARD MASK"

[75] Inventors: John D. Cuthbert, Bethlehem; David P. Favreau, Coopersburg, both of Pa.

[73] Assignee: AT&T Bell Laboratories, Murray Hill, N.J.

[21] Appl. No.: 991,789

[22] Filed: Dec. 17, 1992

[51] Int. Cl.$^5$ .................. H01L 21/306; B44C 1/22; C03C 15/00; C03C 25/06
[52] U.S. Cl. .................. 156/657; 156/651; 156/659.1; 156/662; 156/663; 156/904; 437/228; 437/233
[58] Field of Search ............ 156/644, 651, 657, 659.1, 156/662, 663, 904; 437/40, 41, 42, 228, 233

[56] References Cited

U.S. PATENT DOCUMENTS

| | | | |
|---|---|---|---|
| 4,244,799 | 1/1981 | Fraser et al. | 204/192 |
| 4,521,274 | 6/1985 | Reichmanis et al. | 156/643 |
| 4,683,024 | 7/1987 | Miller et al. | 156/643 |
| 4,935,095 | 6/1990 | Lehter | 156/644 |
| 5,100,503 | 3/1992 | Allman et al. | 156/904 X |

OTHER PUBLICATIONS

Journal of Electrochemical Society: Solid-State Science and Technology, "Contour Modifiers for Optical Lithography," Jul. 1988, by L. K. White, pp. 1844-1846.
Proceedings of the Microlithography Seminar, Interface '90, "Line Width Control over Topography Using Spin-on AR Coating", by Shay Kaplan, pp. 307-314.

Primary Examiner—William A. Powell
Attorney, Agent, or Firm—Richard D. Laumann

[57] ABSTRACT

A layer of spin-on-glass is used as a hard mask for patterning an underlying layer of polysilicon. The patterned polysilicon may be used in the gate structures of field effect transistors.

5 Claims, 1 Drawing Sheet

INTEGRATED CIRCUIT PROCESS USING A "HARD MASK"

TECHNICAL FIELD

This invention relates to integrated circuit fabrication processes which use a hard mask formed by a spin-on-glass.

BACKGROUND OF THE INVENTION

Integrated circuit fabrication processes typically have steps which transfer a pattern from a mask to a substrate by exposing selected portions of a resist covered substrate to radiation. The resist is sensitive to radiation which alters at least one characteristic of the resist. Although direct write schemes are used in some applications, the selective exposure is most frequently obtained by use of the mask. After exposure, selected portions of the resist, defined by the exposure, are removed and the now exposed underlying substrate material is subject to a process step, such as material removal by etching or ion implantation. The pattern should be accurately transferred from the mask to the substrate; that is, there should be minimal differences between the desired feature dimensions and the actual feature dimensions. Bi- and tri-level resists have been developed to facilitate accurate pattern transfer. See, for example, U.S. Pat. Nos. 4,521,274 and 4,244,799 issued to Reichmanis et al. and Fraser et al., respectively.

One dimension of special interest as device dimensions decrease is the gate width of a field effect transistor. This dimension is of great interest for device fabrication because it determines the electrical channel length of the transistor. The channel length is an important parameter in determining the electrical characteristics of the field effect transistors. At half micron or smaller dimensions, variations of the channel length from the desired value become a significant percentage of the channel length and are likely to produce significant deviations from the desired electrical characteristics of the transistor.

The channel length is determined primarily by the width of the gate structure which is obtained by patterning a layer of polysilicon or a tungsten silicide/polysilicon sandwich. Variations in the width of the polysilicon come from several factors of which the two most important are probably the lithography and etch processes. One factor contributing to linewidth variations in the etching process is believed to be a loading effect; that is, the etch rate depends upon the density of the features being etched or the exposed area. A consequence of this effect is that features on wafers with different percentages of exposed areas can have different average linewidths. (It is assumed that the different integrated circuits are being fabricated on the different wafers.) Additionally, on the same wafer, relatively isolated features may have linewidths that differ from those of more compactly situated features.

The presence of the photoresist used as an etch mask is an important parameter in determining the extent of the loading effect. It has been proposed that a dielectric, in the absence of photoresist, be used as the etch mask to reduce the magnitude of the loading effect. In this process, the dielectric is deposited after the polysilicon has been deposited for the gate but prior to the photoresist deposition. In particular, the photoresist is deposited and patterned. The pattern is transferred to the dielectric and the photoresist is stripped. The pattern is then transferred into the polysilicon using the dielectric as a hard mask. Contemplated dielectric materials include silicon oxide or nitride. However, nitride may not have the required etch selectivity with respect to polysilicon to act as a good etch mask. For those applications which form a salicide on the gate, it is necessary to remove the dielectric hard mask from the gate. More generally, it is desirable to remove the hard mask in order to minimize the gate stack height because the taller stacks make planarization more difficult for subsequent levels. However, it is difficult to strip oxide without significant loss of thermal oxide. Most dielectric materials are deposited conformally and do not significantly change the topography of the underlying layer. The resist thus has a thickness which is a function of the local topography. See, for example, L. K. White, *Journal of the Electrochemical Society*, July 1988, pp. 1844–1846, and S. Kaplan, *Proceedings of the Microlithography Seminar*, INTERFACE '90, pp. 307–314. Unfortunately, the variations in resist thickness can be large enough to cause significant variations in linewidths. Variations in thickness can produce standing wave effects. There may also be reflective notching which is produced by resist variations together with the effects of curvature of the underlying substrate.

SUMMARY OF THE INVENTION

A method of integrated circuit fabrication is taught which uses a layer of a nonconformal material, such as a spin-on-glass, as a hard mask for the etching of an underlying layer of material. The method forms features, which have topography, on a substrate, and covers the features with a layer of material that will be patterned. A layer of nonconformal material is now formed and covered with a resist. The resist and the nonconformal material are now patterned and the resist is removed. The nonconformal material is now used as an etch mask and the underlying layer of material is patterned. The nonconformal material may then be removed. In a preferred embodiment, the underlying layer of material is polysilicon. In another preferred embodiment, the layer of nonconformal material is a spin-on-glass (SOG). In yet another preferred embodiment, the SOG is removed using a wet etch solution containing HF acid.

For reasons of clarity, the elements depicted are not drawn to scale.

DETAILED DESCRIPTION

Figure 1:
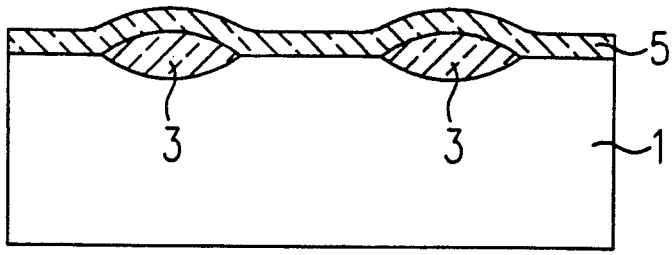
FIGS. 1–4 are sectional views of a portion of an integrated circuit useful in explaining the invention.

The invention will be described by reference to a particular embodiment. Depicted in FIG. 1 is a substrate 1 on which there are features 3 and a layer 5. The features 3 shown are field oxides and layer 5 is polysilicon. The term "substrate" means any material which lies underneath and supports another material. As shown, the substrate has a nonplanar surface; that is, it has topography. Layer 5 will be patterned to form, for example, gate structures. Those skilled in the art will readily select materials and layer thicknesses and fabricate the structure depicted.

Figure 2:
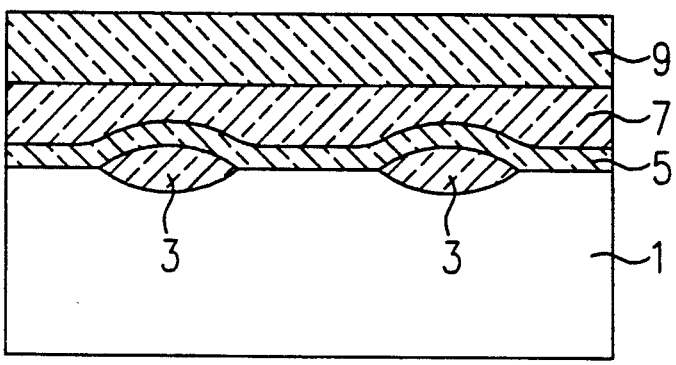

A layer of spin-on-glass(SOG) 7 and a layer of photoresist 9 are now deposited to form the structure depicted in FIG. 2. The term "spin-on-glass" is well known to those skilled in the art and need not be defined. As can be seen, the SOG has a relatively planar surface and has smoothed out the topography of the underlying substrate. By relatively planar, it is meant that the surface is locally planar, although the surface may not be planar over the entire substrate surface. The SOG is put on with conventional techniques. The planarity of the surface depends upon the topography of the underlying material and the thickness of the SOG layer. Those skilled in the art will readily select a thickness for the SOG that is sufficient for it to act as an etch mask for the underlying gate. A thermal treatment or cure is desirably used to densify and flow the SOG. This process step also reduces the topography of the SOG and reduces variations in the resist layer thickness.

Figure 3:
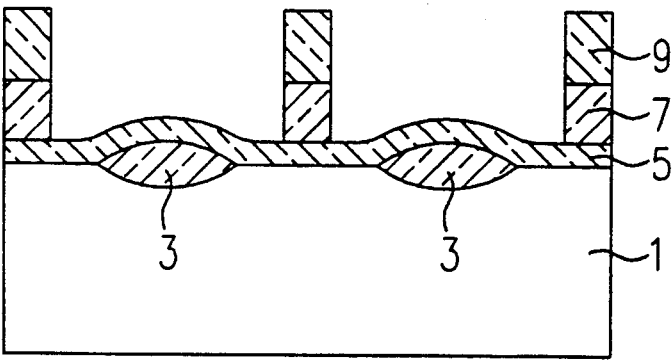

Lithographic techniques are now used to pattern the photoresist. The photoresist is then used as a mask for the etching of the SOG. The etching desirably produces vertical sidewalls in the SOG. The resulting structure is depicted in FIG. 3. Those skilled in the art will readily select appropriate etching techniques and fabricate the structure. The pattern has, for example, gate structures of field effect transistors.

Figure 4:
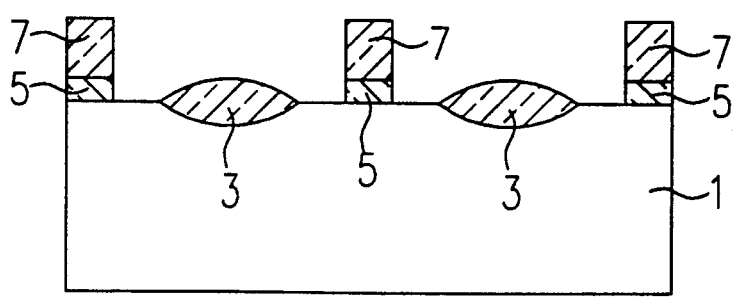

The photoresist is now removed. Conventional techniques may be used. The underlying polysilicon of layer is now etched using the SOG as an etch mask. After the polysilicon has been etched, the SOG is removed using, for example, an HF solution. Such a removal process may be used because of the relative etch rates of SOG to thermal oxide. Depending upon the precise technique used to cure the SOG, etch rate differentials of 15:1 or greater may be obtained. The high etch rates differential makes it possible to remove the SOG without a significant attack on either the gate (thermal) or field oxides. The resulting structure is depicted in FIG. 4.

Standing wave effects with the photoresist/SOG composite can be more severe than with either photoresist or oxide alone due to thickness variations in local topography. Such effects can be alleviated by using, for example, a silicon anti-reflective coating on the SOG or a spin-on coating that acts as an anti-reflective coating which is developed out with the photoresist.

Variations of the embodiment described will be readily thought of by those skilled in the art.

We claim:

1. A method of integrated circuit fabrication comprising the steps of:

forming features on a substrate, said features having topography;

forming a layer of material covering said features;

forming a layer of nonconformal material on said layer of material;

forming a layer of resist on said layer of nonconformal material;

patterning said resist and said layer of nonconformal material;

removing said layer of resist; and patterning said layer of material using said layer of nonconformal material as an etch mask.

2. A method as recited in claim 1 in which said layer of material comprises polysilicon.

3. A method as recited in claim 1 in which said layer of nonconformal material comprises a spin-on-glass.

4. A method as recited in claim 3 further comprising the step of removing said layer of spin-on-glass.

5. A method as recited in claim 4 in which said removing step comprises using a solution comprising HF acid.

* * * * *